United States Patent [19]
Deguchi

[11] Patent Number: 5,883,791
[45] Date of Patent: Mar. 16, 1999

[54] ELECTRONIC CIRCUIT UNIT AND METHOD OF MOUNTING THE SAME

[75] Inventor: Manabu Deguchi, Tokyo, Japan

[73] Assignee: NEC Corporation, Tokyo, Japan

[21] Appl. No.: 825,374

[22] Filed: Mar. 28, 1997

[30] Foreign Application Priority Data

Mar. 29, 1996 [JP] Japan ..................................... 8-077613

[51] Int. Cl.⁶ .............................. H05K 7/14; A47B 96/06
[52] U.S. Cl. ......................... 361/818; 361/736; 361/740; 361/748; 361/800; 248/220.22
[58] Field of Search ..................................... 361/728, 736, 361/740, 743, 748, 752, 759, 796, 800, 801, 802, 818; 248/201, 220.22, 220.31, 222.11, 302, 551

[56] References Cited

U.S. PATENT DOCUMENTS 4,268,100  5/1981  Kekas et al. .
5,169,221  12/1992  Wheeler .
5,644,469  7/1997  Shioya et al. ........................... 361/681

*Primary Examiner*—Leo P. Picard
*Assistant Examiner*—Jayprakash N. Gandhi
*Attorney, Agent, or Firm*—Young & Thompson

[57] ABSTRACT

An electronic circuit unit of the present invention has a plurality of arms rotatably mounted on two side walls thereof facing each other. When the circuit unit is mounted to an electronic apparatus, the angle between each arm to contact the apparatus and the associated side wall of the circuit unit is adjustable in order to vary the height, or level, of the circuit unit above the apparatus. The circuit unit has side walls surrounding a circuit board accommodated in the unit. A top and a bottom cover may be mounted to the circuit unit. Each arm is connected to the respective side wall of the circuit unit by hooks, hinge structure, etc. With this configuration, the level of the circuit unit above the electronic apparatus is readily adjustable.

17 Claims, 7 Drawing Sheets

ELECTRONIC CIRCUIT UNIT AND METHOD OF MOUNTING THE SAME

BACKGROUND OF THE INVENTION

1. Field of the Invention

The present invention relates to an electronic circuit unit to be mounted on an electronic apparatus, and a method of mounting the same. More particularly, the present invention is concerned with an electronic circuit unit whose height, or level, can be easily adjusted, and a method of mounting the same.

2. Description of the Related Art

It is a common practice to configure an electronic circuit capable of being shared by a handy phone, radio modem and other electronic apparatuses as an electronic circuit unit. A conventional electronic circuit to be mounted to, e.g., a handy phone includes a shield case constituted by a thin sheet of metal, and a printed circuit board disposed in the shield case and carrying a radio circuit thereon. A plurality of legs or support members extend downward from the bottom or the sides of the circuit unit. To mount the circuit unit to the electronic apparatus, the legs are soldered to a printed circuit board included in the electronic apparatus or fastened thereto by screws.

However, the problem with the conventional circuit unit is that the legs have a preselected length and determine the height, or level, of the circuit unit above the electronic apparatus. This critically limits the design freedom of the inside arrangement of the apparatus as well as the configuration of a casing included in the apparatus. As a result, wasteful spaces occur in the apparatus, and in addition the apparatus itself becomes bulky.

SUMMARY OF THE INVENTION

It is therefore an object of the present invention to provide an electronic circuit unit whose level above an electronic circuit can be easily changed in accordance with the inside structure and design of the apparatus, and a method of mounting the same.

An electronic circuit unit of the present invention has a circuit board on which an electronic circuit is formed, and a case accommodating the circuit board. The case has side walls surrounding the edges of the circuit board, and a plurality of arms rotatably mounted on two of the side walls facing each other.

A plurality of hooks may be formed on each of the two side walls of the case in order to rotatably hold the associated arm.

A method of mounting the electronic circuit unit to the electronic apparatus of the present invention consists of the steps of placing a plate having a desired thickness in a preselected area of the apparatus expected to mount the circuit unit, positioning the circuit unit on the plate, connecting and affixing the two arms and the apparatus, and removing the plate. Another method consists of locating both ends of one arm on preselected positions on the apparatus, holding the circuit unit at a preselected level, and affixing both ends of the other arm to preselected positions on the apparatus. Finally, the ends of the arm positioned first are affixed. The portions where the arms and circuit unit join each other may be also be affixed.

Because the angle of the arms are freely adjustable, the level of the circuit unit above the apparatus can be easily adjusted in accordance with the structure and design of the apparatus.

BRIEF DESCRIPTION OF THE DRAWINGS

The above and other objects, features and advantages of the present invention will become apparent from the following detailed description when taken with the accompanying drawings in which.

DETAILED DESCRIPTION OF THE PREFERRED EMBODIMENT

Figure 1:
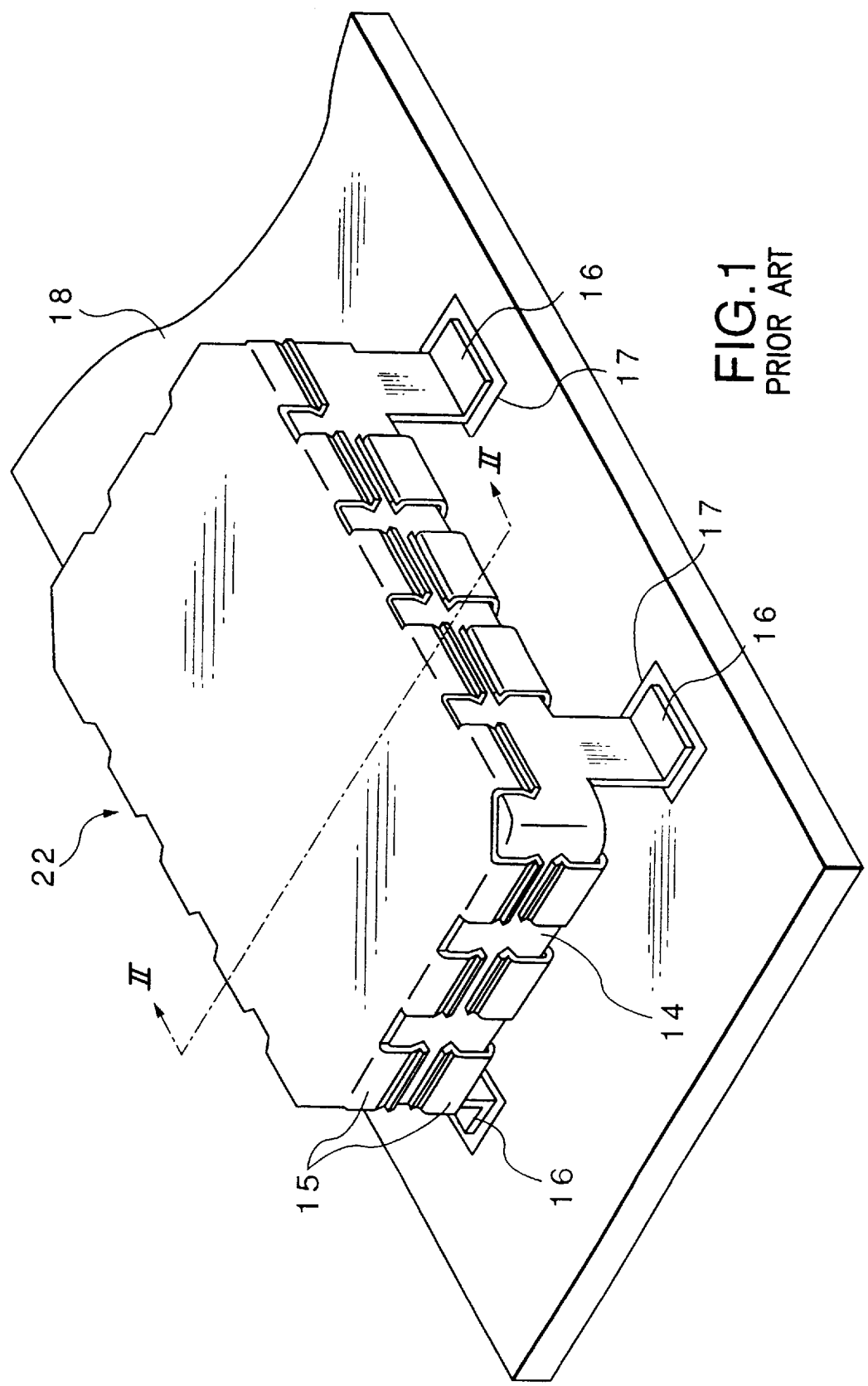
FIG. 1 is a perspective view showing a conventional electronic circuit unit mounted on a printed circuit board.
Figure 2:
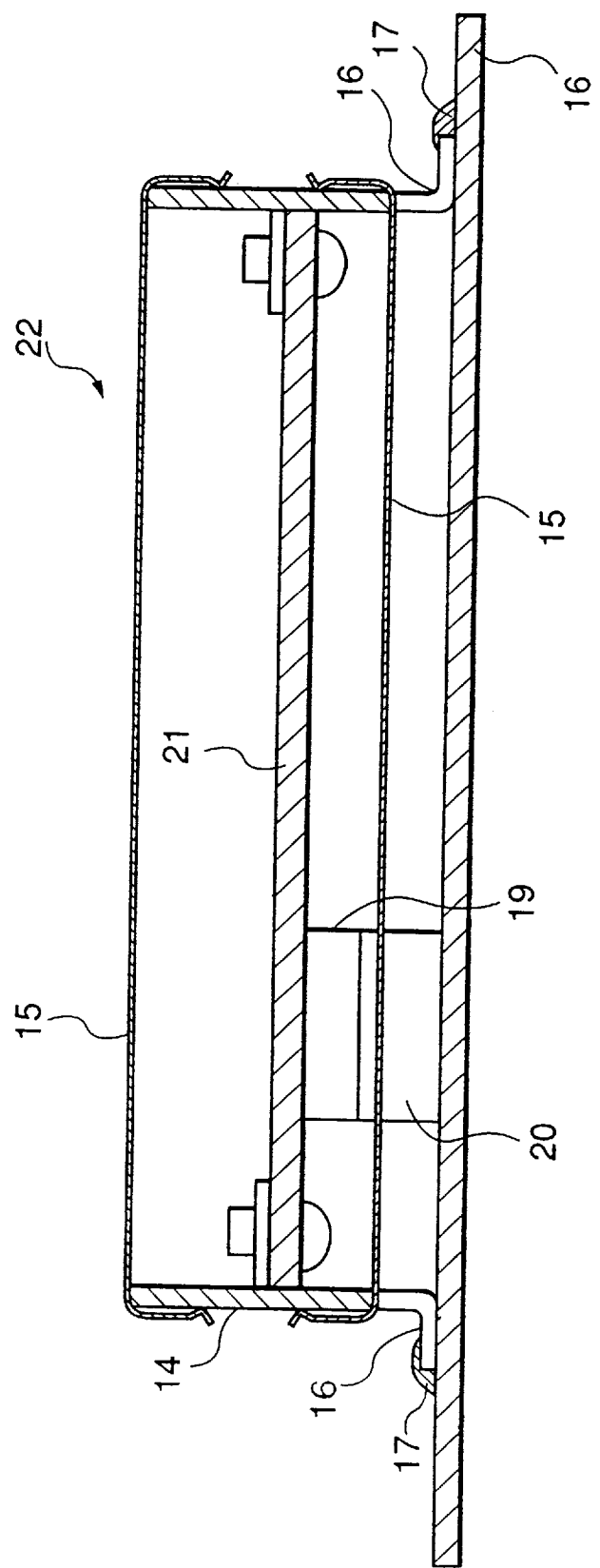
FIG. 2 is a section along line II—II of FIG. 1.

To better understand the present invention, brief reference will be made to a conventional electronic circuit unit, shown in FIGS. 1 and 2. As shown, the electronic circuit unit, generally 22, includes a printed circuit board 21 constituting an electronic circuit portion. The circuit board 21 is disposed in a shield case 14 and fastened thereto by screws. The shield case 14 is implemented by a thin sheet of metal. A top and a bottom shield cover 15 are respectively affixed to the top and bottom of the shield case 14. Legs extend downward from the bottom of the shield case 14, and each has a bent end 16. The bent ends 16 are affixed to a printed circuit board 18 of an electronic apparatus by solder 17. The circuit unit 22 and the printed circuit board 18 are electrically connected together by multipole connectors 19 and 20.

The above configuration, however, has a drawback that the level of the circuit unit 22 mounted on the printed circuit board 18 is determined by the length of the legs of the shield case 14 and cannot be adjusted, as discussed earlier.

Figure 3:
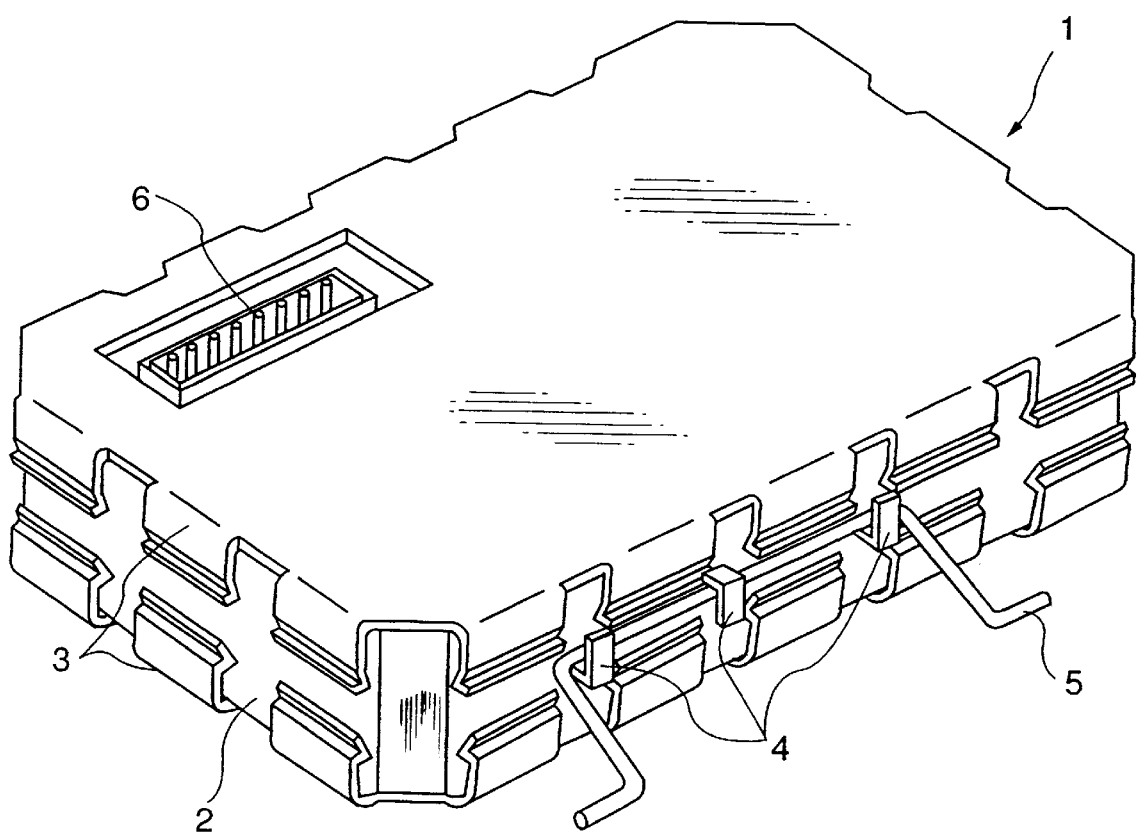
FIG. 3 is a perspective view showing an electronic circuit unit embodying the present invention.

Referring to FIGS. 3–7, an electronic circuit unit and a method of mounting the same embodying the present invention will be described. As shown in FIG. 3, the electronic circuit unit, generally 1, includes a shield case 2 having a frame-like configuration. A top and a bottom shield cover 3 are respectively mounted on the top and bottom of the shield case 2. A through hole is formed in the top shield cover 3, as illustrated. A multipole connector 6 is held in alignment with the through hole for electrically connecting the circuit unit 1 to an electronic apparatus. The frame-like shield case 2 extends along the contour of a printed circuit board 13 affixed to the case 2. An arm 5 is mounted on the outer surface of each of opposite side walls of the shield case 2 by a plurality of hooks 4. At least one of the hooks 4 on each side wall is oriented in the opposite direction to the other hooks 4. In the illustrative embodiment, three hooks 4 are formed on each side wall of the shield case 2, and the center hook 4 is oriented downward while the other hooks 4 are oriented upward. The arm 5 is rotatably supported by the three hooks 4. In the embodiment, each hook 4 is formed by cutting a part of the shield cover 3 and then bending the cut part in the form of a hook. Alternatively, the hooks 4 may be implemented as independent members and affixed to the side of the shield cover 3. The opposite ends of each arm 5 are bent so as to contact the electronic apparatus easily.

Figure 4:
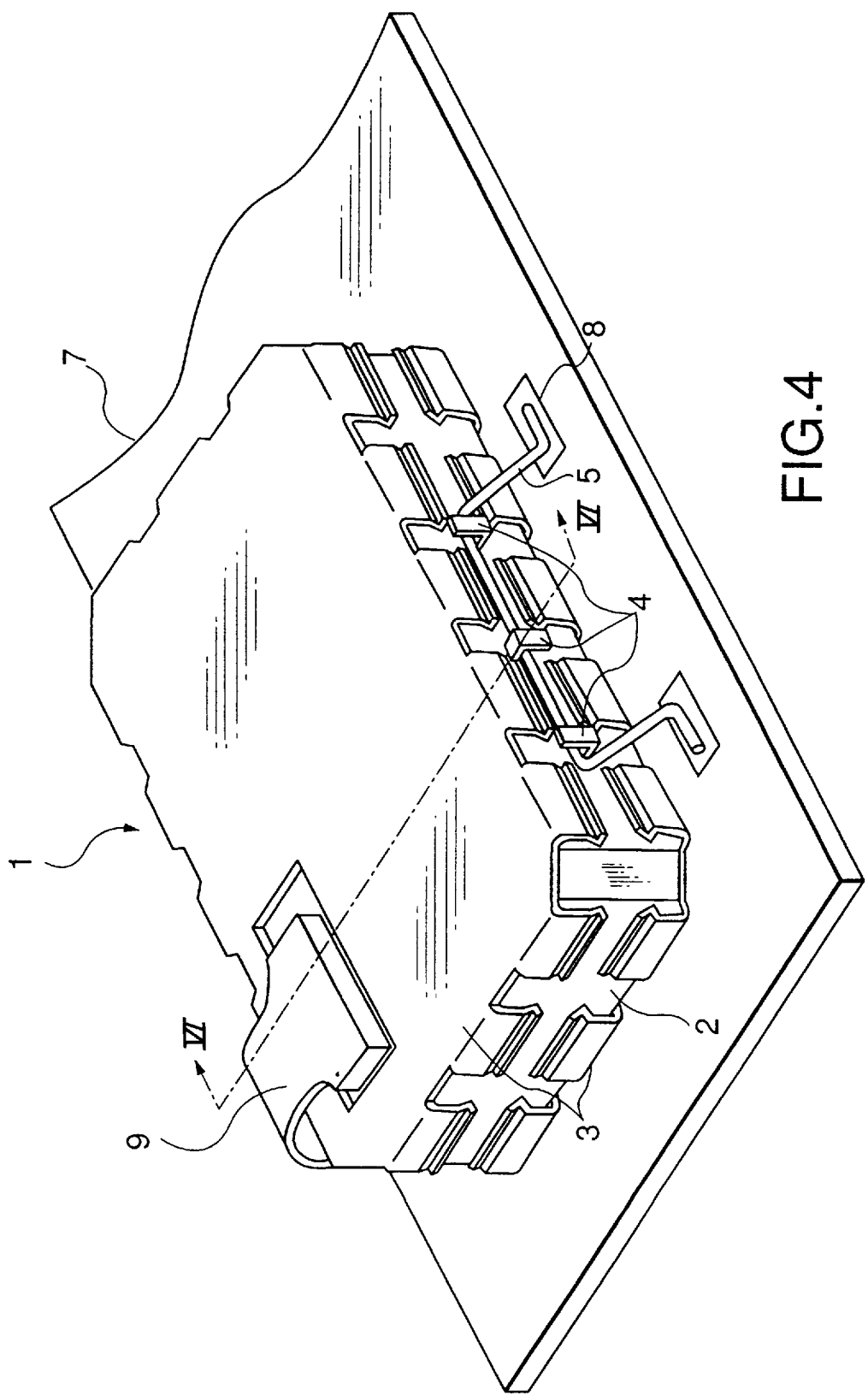
FIGS. 4 and 5 are perspective views each showing a specific condition in which the circuit unit shown in FIG. 3 is mounted on a printed circuit board included in an electronic apparatus.

FIG. 4 shows a specific configuration in which the circuit unit 1 is connected to a printed circuit board 7 included in the electronic apparatus. As shown, each arm 5 rotatably supported by the hooks 4 has its opposite ends soldered to lands 8 provided on the printed circuit board 7. A flexible printed circuit board 9 connects the multipole connector 6 to the printed circuit board 7, as illustrated.

Figure 5:
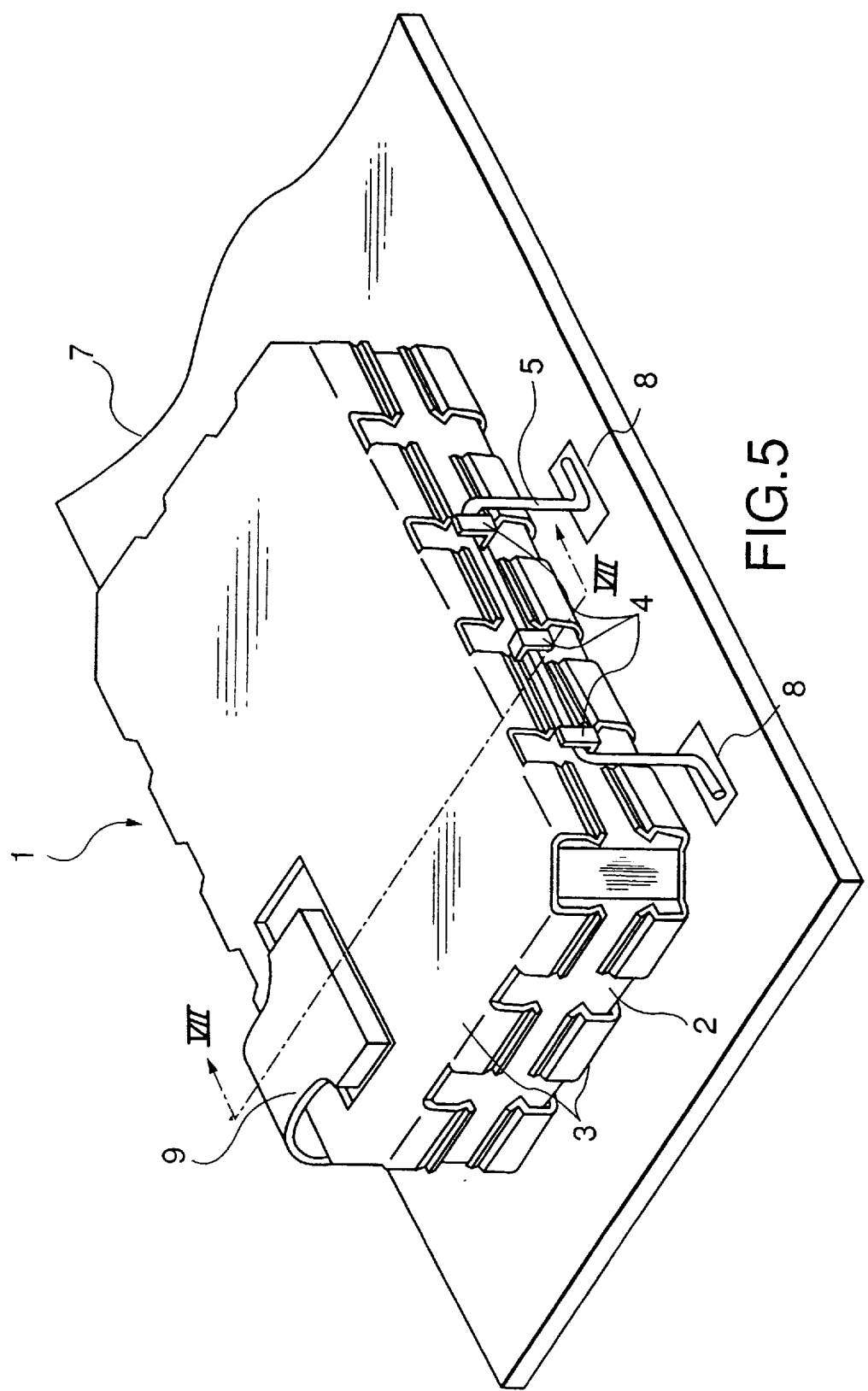

FIG. 5 shows another specific configuration in which the circuit unit 1 is connected to the circuit board 7. As shown, the angle between the arm 5 and the side wall of the shield case 2 shown in FIG. 5 is smaller than the angle shown in FIG. 4. Therefore, the circuit unit 1 is located at a level, as measured from the circuit board 7, higher than the level of the circuit unit 1 shown in FIG. 4.

Figure 6:
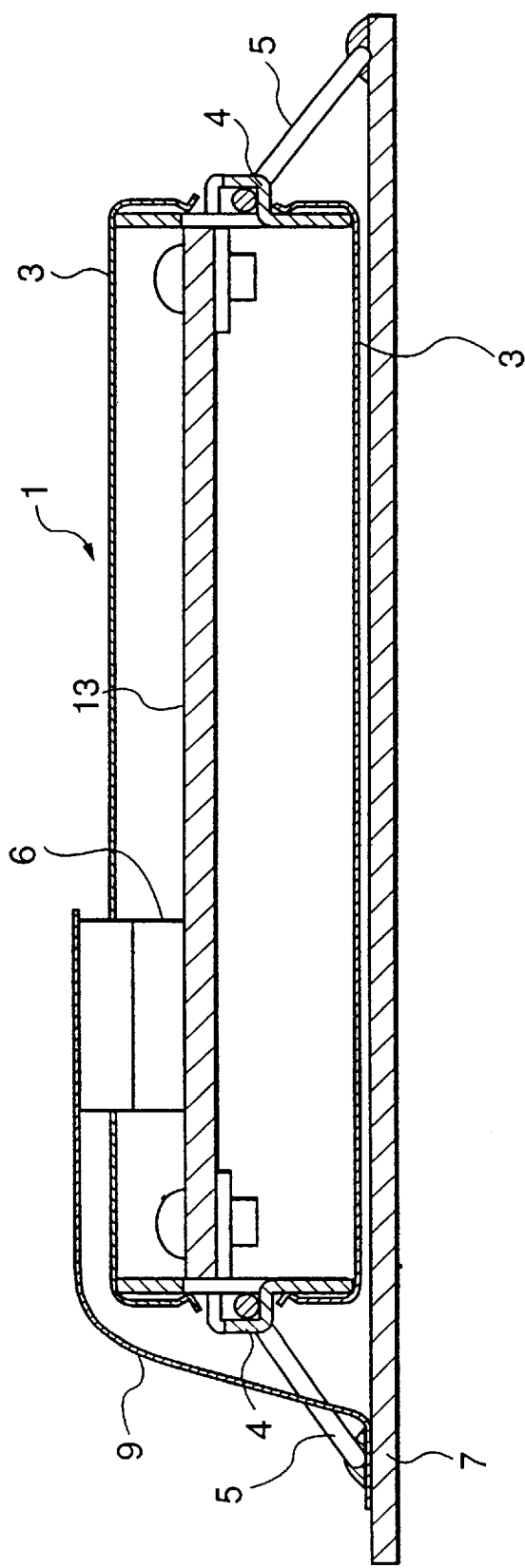
FIG. 6 is a section along line VI—VI of FIG. 4.

FIG. 6 is a section along line VI—VI shown in FIG. 4. As shown, because the angle between the arm 5 and the side wall of the shield case 2 is comparatively great, the distance between the bottom shield cover 3 and the circuit board 7 is comparatively small. The multipole connector 6 mounted on the circuit board 13 of the circuit unit 1 is connected to the circuit board 7 by the flexible circuit board 9. The circuit board 13 is fastened to projections extending from the inner periphery of the shield case 2 by screws. These projections may be formed by bending a part of the shield case 2 or may be implemented as independent members prepared beforehand.

Figure 7:
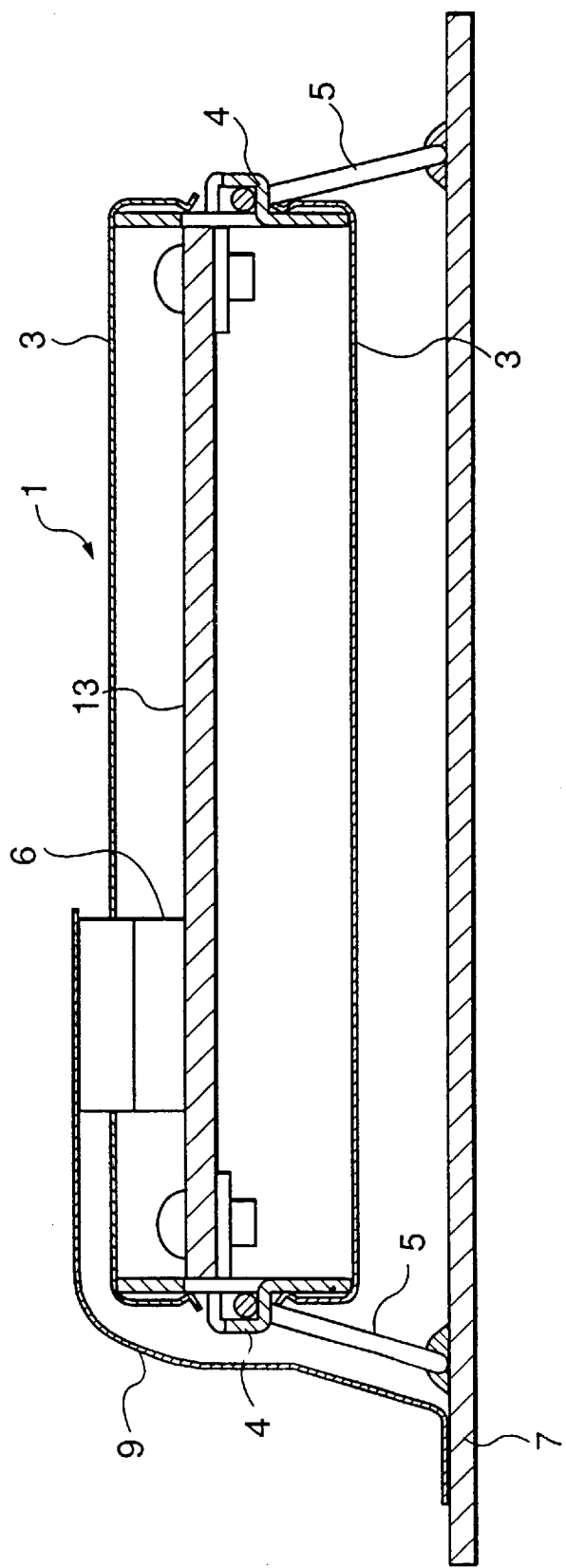
FIG. 7 is a section along line VII—VII of FIG. 5.

FIG. 7 is a section along line VII—VII of FIG. 5. As shown, the angle between the arm 5 and the side wall of the shield case 2 is comparatively small, the distance between the bottom shield cover 3 and the circuit board 7 is comparatively great.

Specific procedures for mounting the circuit unit 1 to the circuit board 7 are as follows. A first specific procedure begins with a step of laying a plate of desired thickness in the area of the circuit board 7 expected to mount the circuit unit 1. Then, the circuit unit 1 is placed on the plate such that the two arms 5 lie above the lands 8 of the circuit board 7. Subsequently, the arms 5 are rotated to contact the lands 8 and then soldered to the lands 8. At this instant, the arms 5 and the associated connecting portions of the shield case 2 may also be soldered. Thereafter, the above plate is removed from below the circuit unit 1. In this manner, only if a plate whose thickness corresponds to a desired distance between the circuit unit 1 and the circuit board 7 is used, the circuit unit 1 can be easily mounted to the circuit board 7 at a desired distance from the circuit board 7.

In another specific procedure, either one of the arms 5 of the circuit unit 1 is temporarily fixed in place on the lands 8 or terminal portions of the circuit board 7 by, e.g., a jig, not shown. The jig is located on the circuit board 7 and supports both ends of the arm 5 in order to prevent them from sliding on the lands 8. Subsequently, the circuit unit 1 is positioned at a desired level above the circuit board 7, and then the other arm 5 is soldered to the other lands 8 of the circuit board 7. Thereafter, the arm 5 temporarily fixed in place is soldered to the associated lands 8. At this instant, the connecting portions rotatably supporting the arm 5 may also be soldered.

The hooks 4 may each be shaped in the form of a letter L or J by way of example. The orientation (upward or downward) of each hook 4 shown and described is only illustrative. If desired, the arm 5 may be passed through annular mounting members provided on the side wall of the shield case 2 and rotatably connected to the shield case 2 thereby. Further, the arm 5 may be rotatably connected to the shield case 2 by a hinge structure. In addition, the arm 5 may be implemented as a flat member in place of a metallic wire shown and described. The circuit unit 1 may have more than two arms.

To protect the circuit unit 1 from noise, the top and bottom shield covers 3 may be formed of metal and mounted to the shield case 2 also formed of metal. However, one or both of the shield covers 3 may be omitted, if necessary. The shield case 2, shield covers 3 and arms 5 should preferably be made of metal. The shield case 2 and arms 5 are advantageously formed of materials which can be soldered.

Assuming a portable radio apparatus, for example, the circuit unit 1 is usually about 4 cm long, 6 cm wide, and 1 cm to 1.5 cm thick. The circuit unit 1 is spaced about 1 cm from the surface of the circuit board 7 which it faces. If desired, a plurality of circuit boards may be accommodated in the circuit unit 1.

In summary, the present invention allows the level of an electronic circuit unit to be easily adjusted, and therefore allows it to be efficiently mounted to any desired electronic apparatus.

While the present invention has been described in connection with a certain preferred embodiment, it is to be understood that the subject matter encompassed by the present invention is not limited to the specific embodiment. On the contrary, it is intended to include all alternatives, modifications, and equivalents as can be included within the spirit and scope of the following claims.

What is claimed is:

1. An electronic circuit unit to be mounted to an electronic apparatus, comprising:

a circuit board on which an electronic circuit is formed;

a case accommodating said circuit board and having side walls surrounding said circuit board;

a plurality of arms respectively rotatably supported by two of said side walls of said case facing each other; and a plurality of hooks on an outer surface of each of the two side walls of said case for rotatable supporting said arms.

2. A unit as claimed in claim 1, wherein at least one of said plurality of hooks is oriented in an opposite direction to the other hooks.

3. A unit as claimed in claim 1, wherein said plurality of hooks are formed by cutting a part of associated one of said two side walls and then bending said part.

4. A unit as claimed in claim 1, further comprising a connector mounted on said circuit board, for connecting said unit to the electronic apparatus.

5. An electronic circuit unit to be mounted to an electronic apparatus, comprising:

a circuit board on which an electronic circuit is formed;

a case accommodating said circuit board and having side walls surrounding said circuit board;

a plurality of arms respectively rotatable supported by two of said side walls of said case facing each other; and a top cover and a bottom cover respectively covering tops and bottoms of said side walls of said case.

6. A unit as claimed in claim 5, further comprising a plurality of hooks formed on an outer surface of each of the two side walls of said case, and rotatably supporting associated one of said pair of arms.

7. An electronic circuit unit to be mounted to an electronic apparatus, comprising:

a circuit board on which an electronic circuit is formed;

a case accommodating said circuit board and having side walls surrounding said circuit board;

a plurality of arms respectively rotatable supported by two of said side walls of said case facing each other; and projections extending from an inner periphery of said case, for retaining said circuit board.

8. A unit as claimed in claim 7, further comprising a plurality of hooks formed on an outer surface of each of the two side walls of said case, and rotatably supporting associated one of said pair of arms.

9. A unit as claimed in claim 7, further comprising a top cover and a bottom cover respectively covering tops and bottoms of said side walls of said case.

10. An electronic circuit unit to be mounted to an electronic apparatus, comprising:

a circuit board on which an electronic circuit is formed;

a case accommodating said circuit board and having side walls surrounding said circuit board;

a plurality of arms respectively rotatable supported by two of said side walls of said case facing each other;

wherein said arms are connectable to the electronic apparatus and wherein each of said arms comprises a wire having bent ends.

11. A unit as claimed in claim 10, further comprising a plurality of hooks formed on an outer surface of each of the two side walls of said case, and rotatably supporting associated one of said pair of arms.

12. A unit as claimed in claim 10, further comprising projections extending from an inner periphery of said case, for retaining said circuit board.

13. A unit as claimed in claim 10, further comprising a top cover and a bottom cover respectively covering tops and bottoms of said side walls of said case.

14. A method of mounting an electronic circuit unit having a plurality of arms rotatably mounted on two side walls thereof facing each other to an electronic apparatus, said method comprising the steps of:

placing a plate having a desired thickness on said electronic apparatus;

positioning said electronic circuit unit on said plate, and connecting and affixing said pair of arms to said electronic apparatus; and removing said plate.

15. A method as claimed in claim 14, further comprising the step of affixing connecting portions where said case and said pair of arms are connected.

16. A method of mounting an electronic circuit unit having a plurality of arms rotatably mounted on two side walls thereof facing each other to an electronic apparatus, said method comprising the steps of:

placing opposite ends of one of said pair of arms at predetermined positions on said electronic apparatus;

holding said electronic circuit unit at a preselected level, affixing opposite ends of the other arm to preselected positions on said electronic apparatus; and affixing the opposite ends of the one arm.

17. A method as claimed in claim 16, further comprising the step of affixing connecting portions where said case and said pair of arms are connected.

* * * * *